United States Patent [19]

Beha et al.

[11] Patent Number: 4,473,833
[45] Date of Patent: Sep. 25, 1984

[54] ASYMMETRIC INTERFEROMETERS WITH JOSEPHSON JUNCTIONS OF EQUAL MAGNETIC LENGTH

[75] Inventors: Hansjörg Beha; Wilhelm Jutzi, both of Karlsruhe, Fed. Rep. of Germany

[73] Assignee: Universität Karlsruhe, Karlsruhe, Fed. Rep. of Germany

[21] Appl. No.: 239,978

[22] Filed: Mar. 3, 1981

[30] Foreign Application Priority Data

Mar. 8, 1980 [DE] Fed. Rep. of Germany ....... 3008926

[51] Int. Cl.$^3$ .......................... H01L 39/22; H03K 3/38
[52] U.S. Cl. .......................................... 357/5; 307/306
[58] Field of Search ........................ 357/5; 324/715 C; 307/306

[56] References Cited

U.S. PATENT DOCUMENTS 3,978,351  8/1976  Zappe ..................................... 357/5

OTHER PUBLICATIONS

IEEE Transactions on Magnetics, vol. MAG-15, No. 1, Jan., 1979 entitled "Dynamics of an Asymmetric Nondestructive Read Out Memory Cell".
Hasuo et al., "Fabrication of DC–Squid's and Their Characteristics for Digital Applications" *Jap. Journal of Applied Physics,* 19 Supp 19-1 (1980), pp. 595-599.
Zappe, H. H., "Josephson Quantun Interference Computor Devices", *IEEE Trans. on Magnetics,* MAG-13, No. 1, Jan. 1977, pp. 41-47.

*Primary Examiner*—Martin H. Edlow
*Assistant Examiner*—J. L. Badgett
*Attorney, Agent, or Firm*—Kenyon & Kenyon

[57] ABSTRACT

An asymmetrical interferometer having two Josephson junctions with unequal contact areas. In accordance with the invention, the magnetic flux magnitudes of the control lines of the Josephson junctions are approximately equal in each Josephson junction. In a preferred embodiment, the length of the Josephson junctions along a direction parallel to the control line are equal to each other. Moreover, each Josephson junction is provided with a counterelectrode metalization, the counterelectrode metalizations having substantially equal widths measured in a direction orthogonal to the control line. The widths of the counterelectrode metalizations are larger than the width of an inductive connection between the Josephson junctions.

3 Claims, 2 Drawing Figures

ASYMMETRIC INTERFEROMETERS WITH JOSEPHSON JUNCTIONS OF EQUAL MAGNETIC LENGTH

BACKGROUND OF THE INVENTION

1. Field of the Invention

This invention relates generally to asymmetrical interferometers, and more particularly to an interferometer wherein the areas of the Josephson junctions are not equal, and the magnetic lines of flux in the Josephson junctions are of substantially equal magnitude.

2. Description of the Prior Art

Asymmetrical interferometers are known to consist of inductive connections, or bridges, between Josephson junctions wherein the maximum Josephson currents in the Josephson junctions are of unequal magnitude. The maximum Josephson current of an interferometer $I_G$ is modulated with a control current $I_C$ by the magnetic field of a control line arranged above an inductive bridge. Asymmetrical interferometers are used instead of symmetrical interferometers having equal maximum Josephson currents, illustratively as storage cells for the nondestructive readout of individual flux quanta. Such a use is described in a published, nonprosecuted patent application (Offenlegungsschrift) No. 27 35 133, of H. Beha and W. Jutzi filed Aug. 4, 1977. In addition, asymmetrical interferometers have been used as logic gates in situations where the operating current must have particularly large tolerances. The use of an asymmetrical interferometer as a logic gate is described in the article "Asymmetric 2-Josephson Junction Interferometer As A Logic Gate," by H. Beha, Electronics Letters, Volume 13, pages 218 to 220, March, 1977.

Designers of asymmetrical interferometers usually optimize the devices under the simplifying assumption that the magnetic field of the control line in the interior of the Josephson contact is negligibly small. Under such assumptions, the interferometers are deemed to have point contacts.

The maximum Josephson current $I_G$ of interferometers which are deemed to have point contacts can be calculated relatively simply as a function of the control current $I_C$ and the number N of the flux quanta included in the interferometer loop. For each flux quantum state M, there is a closed area in the $I_G$, $I_C$-plane. Such a relationship is generally referred to as the "gate characteristic."

FIG. 1 is a plot of normalized gate current $i_G = I_G/I_O$ as a function of normalized control current $i_C = I_C/I_O$. The regions of the different flux quantum states of interferometers having two hypothetical point contacts merge into each other by displacement along $i_c$ axis. For example, all of the maxima of the flux quantum states have the same height along the $i_c$ axis. FIG. 1, which is a normalized graphical representation of the maximum Josephson current $I_G$ plotted against the control current $I_C$, illustrates the gate characteristic. As indicated, FIG. 1 shows the maximum Josephson current $I_G$ as a function of control current $I_C$, i.e., $I_G = f(I_C)$, where a parameter N is shown for an interferometer having two hypothetical point contacts, and with a ratio of maximum Josephson currents of 2/1 and with a characteristic phase:

$$\lambda = 2\pi L I_O/\phi_O = 2\pi$$

In this characteristic phase equation, L is the inductance of the bridge between the contacts and $I_O$ is the maximum Josephson current of the smaller contact without external magnetic field. Also, $\phi_O = 2.07$ mVps is a flux quantum.

It is a problem with this analysis that if the interferometer is extremely miniaturized, the magnetic flux of the Josephson junctions can no longer be neglected in comparison with the flux of the interferometer ring, because of the finite resolution of the structuring processes. In contrast to interferometers having hypothetical point contacts, variations in the quantum states are especially pronounced and unfavorable in asymmetrical interferometers having Josephson junctions which have appreciably different contact lengths measured along the direction parallel to the control line. This results from the fact that a given magnetic control field will decrease the maximum Josephson current of the contact having the longer contact length noticeably more than the maximum Josephson current of the shorter contact. Thus, the inequality of the maximum Josephson currents, which is advantageous for producing large tolerances of the contacts, is reduced by the modulation.

SUMMARY OF THE INVENTION

The foregoing problems are alleviated by the present invention which provides an asymmetrical interferometer having two Josephson junctions with unequal contact areas wherein the magnetic flux of the respective control lines, within the Josephson junctions, are nearly of the same magnitude.

The desired ratio between the maximum Josephson currents of the two Josephson junctions can be kept unchanged if the magnetic flux $\phi_e$ in each of the contacts is changed in the desired ratio. In accordance with this particular case, the resulting gate characteristic can be obtained by multiplication of the characteristic of the individual Josephson contact by that of the interferometer with point contacts. If, in addition, both Josephson junctions are short as compared to the Josephson depth of penetration, the characteristic of the individual Josephson contact is particularly simple:

$$I_e = I_O (\sin x/x),$$

where $$x = \pi \phi_e/\phi_O$$

In this case, the maxima of the flux quantum states becomes smaller with increasing absolute amount $|I_C|$ for $\phi_e < \phi_O$.

BRIEF DESCRIPTION OF THE DRAWINGS

Comprehension of the invention is facilitated by reading the following detailed description in conjunction with the annexed drawings, in which.

DETAILED DESCRIPTION

Figure 1:
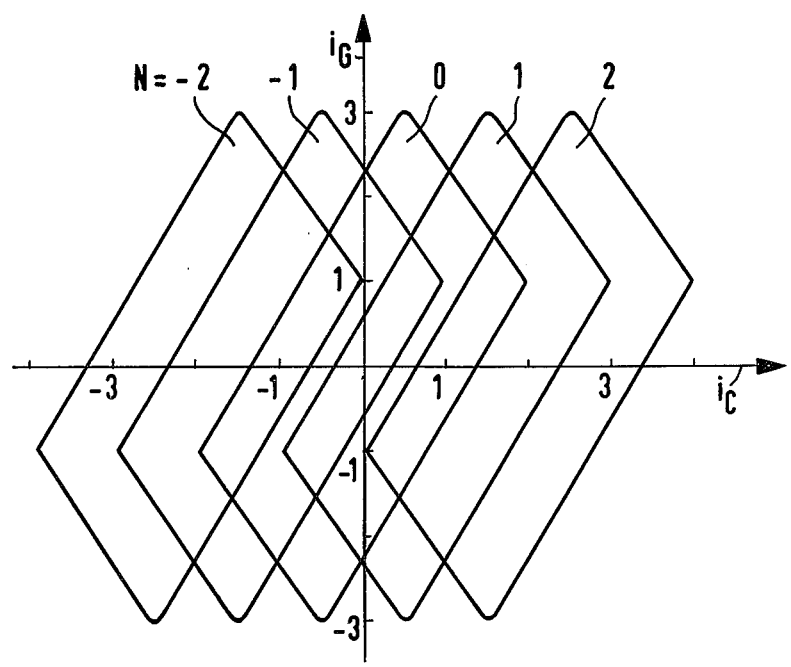
FIG. 1 is a plot of the maximum Josephson current $i_G$ against the control current $i_C$ for various values of flux quantum state N, this drawing being useful in explaining the background of the gate characteristic.
Figure 2:
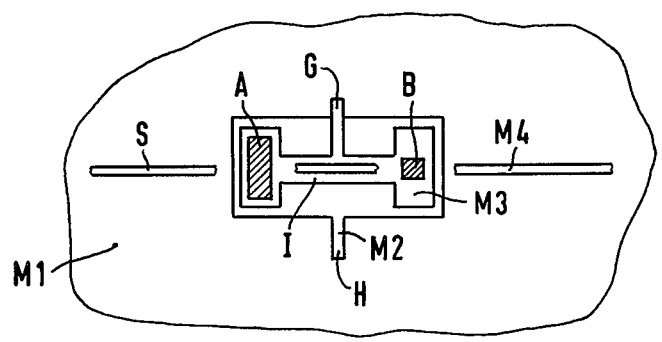
FIG. 2 is a design and schematic representation of an asymmetrical interferometer having a ratio of maximum Josephson currents of 3:1.

FIG. 2 is a schematic and design illustration of an asymmetrical interferometer having a ratio of maximum Josephson currents of 3:1. A superconducting base plate 10 and thick insulating layer (not specifically designated) support a structured superconducting layer 11. Structured superconducting layer 11 forms a lower electrode of two Josephson contacts 13 and 14. Above structured superconducting layer 11 is arranged an insulating layer, illustratively of silicon oxide, having a thickness of approximately 200 nm. In the region of the shaded areas, the thick insulating layer has openings which expose structured superconducting layer 11. In this area, the thin tunnel oxide is generated. The two shaded portions, 13 and 14, differ by a factor of 3 in relative area. In accordance with the invention, the magnetic lengths of the contacts, which correspond to the sides of the areas parallel to a control line 17, are equal.

A further superconducting layer 18 is arranged on the thick and thin oxide layers. Superconducting layer 18 forms the upper electrode of the Josephson contacts and the upper connection between the contacts. The entire width of superconducting layer 18 at each Josephson contact is the same. Thus, the magnetic field of the control line at both Josephson contacts has the same magnitude.

The width of the upper connection 15 between the contacts can be kept smaller than the total width over the thick and thin oxide layers if the inductance of the connection is to be as high as possible for a given length. Control line 17 is arranged on an insulator in a further structured superconducting layer 20. In FIG. 2, gate current flows through the interferometer from contacts 22 to 23.

Although the invention has been described in terms of a specific embodiment and application, persons skilled in the art, in light of this teaching, can generate additional embodiments without exceeding the scope or departing from the spirit of the claimed invention. Accordingly, it is to be understood that the drawings and descriptions in this disclosure are proffered to facilitate comprehension of the invention and should not be construed to limit the scope thereof.

What is claimed is:

1. A Josephson junction interferometer comprising:
   (a) a base plate;
   (b) a first insulating layer formed on said base plate;
   (c) a first layer of metalization disposed over said insulating layer;
   (d) a second insulating layer formed over said first layer of metalization;
   (e) openings, spaced from each other along a line, in said second insulating layer at the bottom of which, contacting said first layer of metalization, a thin tunnel oxide is formed, one of said openings having an area greater than the other;
   (f) a second layer of metalization having portions disposed over said second insulating layer and over said thin tunnel oxide at least in the areas of said two openings whereby Josephson junctions of unequal area will be formed at said openings, said first and second layers of metalization forming the contacts thereof;
   (g) a third insulating layer formed over said second layer of metalization;
   (h) a control line formed in a third metalization layer over said third insulating layer overlying and extending between said junctions in the direction of said line; and
   (i) at least one of said metalization layers patterned such as to provide substantially equal flux in said two Josephson junctions.

2. The interferometer of claim 1, wherein both openings have the same length along said line but unequal widths perpendicular thereto and wherein said portions of said second second metalization layer overlying said areas are of equal width perpendicular to said line.

3. The interferometer of claim 1, wherein said second layer of metalizations include a portion extending along said line, between said junctions, interconnecting the portions of said second layer of metalization in the area of said openings and wherein the width of said portion is smaller than the width of the portions in the area of said openings.

* * * * *